(12) United States Patent
Cheng et al.

(10) Patent No.: US 10,141,045 B2
(45) Date of Patent: Nov. 27, 2018

(54) DUAL RAIL DEVICE WITH POWER DETECTOR FOR CONTROLLING POWER TO FIRST AND SECOND POWER DOMAINS

(71) Applicant: Taiwan Semiconductor Manufacturing Co., Ltd., Hsin-Chu (TW)

(72) Inventors: Chiting Cheng, Taichung (TW); Yangsyu Lin, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/471,937

(22) Filed: Mar. 28, 2017

(65) Prior Publication Data

US 2018/0174643 A1 Jun. 21, 2018

Related U.S. Application Data

(60) Provisional application No. 62/434,558, filed on Dec. 15, 2016.

(51) Int. Cl.
   *G11C 11/417* (2006.01)
   *H01L 27/11* (2006.01)
   *H01L 23/528* (2006.01)

(52) U.S. Cl.
   CPC ........ *G11C 11/417* (2013.01); *H01L 23/5286* (2013.01); *H01L 27/1104* (2013.01); *H01L 27/1116* (2013.01); *Y10T 307/675* (2015.04); *Y10T 307/735* (2015.04)

(58) Field of Classification Search
   CPC .............. G11C 11/417; H01L 27/1116; H01L 27/1104; H01L 23/5286; Y10T 307/675; Y10T 307/735; Y10T 307/625
   See application file for complete search history.

(56) References Cited

U.S. PATENT DOCUMENTS

| | | | |
|---|---|---|---|
| 2005/0253462 A1* | 11/2005 | Falkowski | H02J 1/14 307/43 |
| 2011/0188326 A1 | 8/2011 | Lee et al. | |
| 2015/0168982 A1* | 6/2015 | Pilo | G05F 3/267 365/154 |
| 2015/0206578 A1* | 7/2015 | Goel | G11C 11/419 365/154 |
| 2015/0340073 A1* | 11/2015 | Seo | G11C 7/222 365/189.09 |
| 2016/0111134 A1 | 4/2016 | Kim et al. | |

OTHER PUBLICATIONS

Official Action dated Apr. 27, 2018 in corresponding Taiwan Patent Application No. 10720366420.

* cited by examiner

*Primary Examiner* — Richard Elms
*Assistant Examiner* — Jerome Leboeuf
(74) *Attorney, Agent, or Firm* — Duane Morris LLP

(57) ABSTRACT

A dual rail device includes a first power domain circuit coupled to a first power supply through a first header control switch and a second power domain circuit coupled to a second power supply. The first and second power supplies have different steady-state voltage levels. The first power domain circuit is interfaced to the second power domain circuit. The device also includes a power detector circuit for providing a control signal for the first header control switch responsive to a voltage level of the second power supply.

20 Claims, 8 Drawing Sheets

DUAL RAIL DEVICE WITH POWER DETECTOR FOR CONTROLLING POWER TO FIRST AND SECOND POWER DOMAINS

CROSS-REFERENCE TO RELATED APPLICATIONS

This application claims the benefit of and priority to U.S. Provisional Patent Application No. 62/434,558 filed Dec. 15, 2016, the entirety of which is hereby incorporated by reference herein.

BACKGROUND

Dual rail devices, such as dual rail static random access memory (SRAM), have different logic circuits operating at different power supply voltage. For example, a part of the SRAM, called a memory periphery logic circuit, can operate at a lower power supply voltage VDD than the bits of the memory array, which operate at a higher supply voltage VDDM, to reduce dynamic power consumption. This technique allows for reduction of the active power while maintaining sufficient performance. However, dual rail designs suffer significant cross domain leakage when turning on/off the two power supplies.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
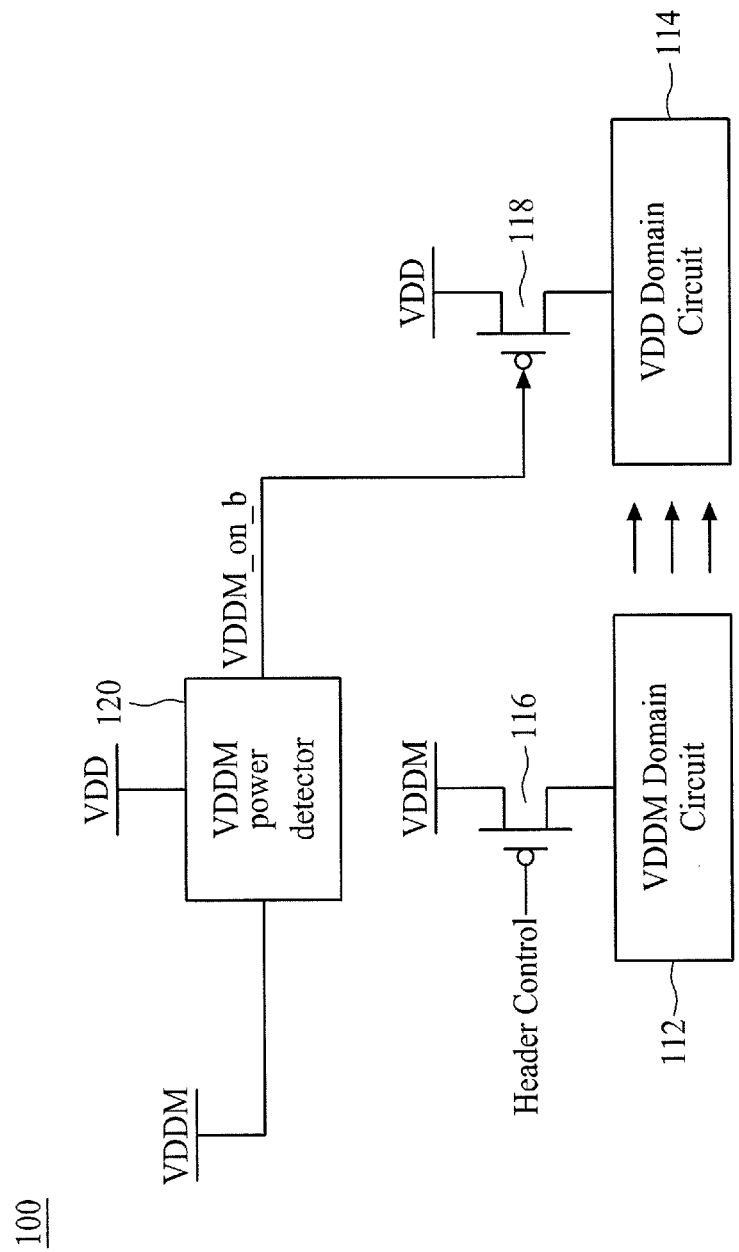
FIG. 1 illustrates a dual rail device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure relates to dual rail devices, which in embodiments can be an SRAM device. A dual rail device includes a first circuit that operates in the VDDM power domain. This circuit may be referred to as a VDDM domain circuit. The device also includes a second circuit that operates in the VDD power domain. This circuit may be referred to as a VDD domain circuit. The VDD domain circuit 14 may be, for example, a memory periphery logic circuit that operate at a lower power supply voltage VDD and the VDDM domain circuit may be an array of SRAM cells that operate at a higher supply voltage VDDM. The circuits are interfaced to one another. VDDM may be a higher power supply than VDD. The VDDM domain circuit is connected to the VDDM supply through a respective header switch under control of a header control signal. The VDD domain circuit is connected to the VDD supply through a respective header switch under control of a header control signal. Header switches may be PMOS transistor switches, meaning the VDDM domain circuit and VDDM domain circuit are coupled to the power supplies (VDDM and VDD) when the header control signals are logical low. Of course, the other types of switches, such as NMOS transistor switches, may be used.

The timing of VDDM power supply ramp up and ramp down during, for example, device power up and power down, respectively, is now discussed. It should be understood that VDD and VDDM may be powered on/off at different times and independent of one another. Assume a situation where VDD is already at its proper level before VDDM is switched on. Of course, the opposite situation, i.e., where VDDM is already at or near its proper level before VDD is switched on, is also possible. Also, assume five consecutive time periods (a) to (e). During period (a), VDD is at its proper level and connected to the VDD domain circuit. VDDM is not on. During this time period, there is a large undesirable interface leakage current between the VDDM domain circuit and the VDD domain circuit. During time period (b), VDDM is turned on and ramps up towards its target or steady-state value. During this time there is still undesirable leakage current between the VDDM domain circuit and the VDD domain circuit. During time period (c), VDDM reaches its proper value and both VDDM domain and VDD domain circuits are operational. There are no leakage current concerns during this period (c) with both VDDM domain and VDD domain circuits powered and operational and the VDDM value exceeding the value of VDD. During period (d), VDDM is turned off and ramps down. As with period (b), there is undesirable leakage current between the VDDM and VDD domain circuits. Finally, during period (e), VDDM is fully off. As with period (a), there is a large amount of undesirable leakage current between the VDDM and VDD domain circuits during this period.

In an embodiment illustrated in FIG. 1, a dual-rail device 100 includes VDDM domain circuit 112, VDD domain circuit 114, and VDDM header switch 116 and VDD header switch 118 that are responsive to header control signal. The dual rail device 100 includes a VDDM power detector 120 that is coupled to both VDDM and VDD power supplies and provides header control signal VDDM_on_b for controlling VDD header switch 118. Basically, in the embodiment of FIG. 1, the VDDM power detector operates to open the VDD domain header switch 118 to prevent or reduce VDD domain leakage when VDDM is lower than a given threshold or thresholds. The operation of VDDM power detector is explained in more detail in connection with the timing diagram of FIG. 2.

Figure 2:
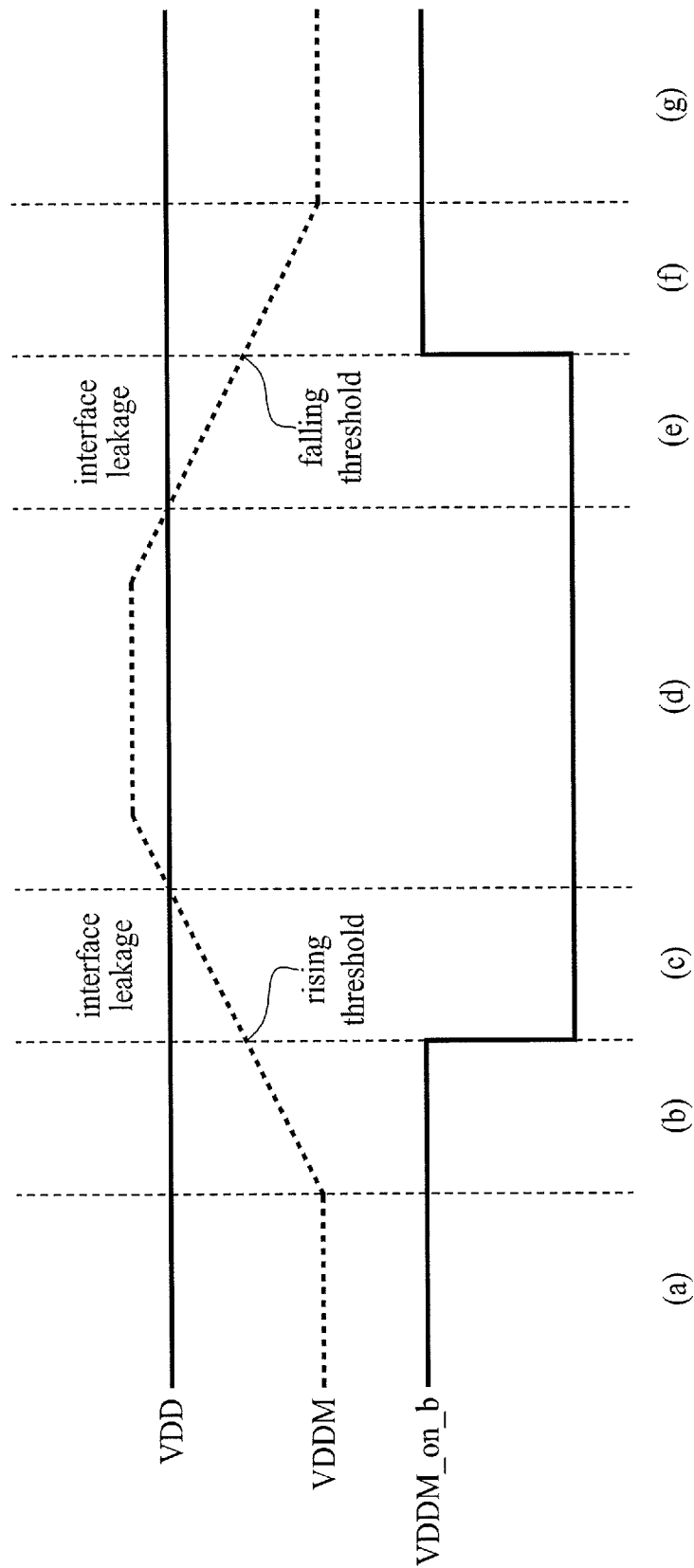
FIG. 2 is a timing diagram showing VDDM power supply ramp up and ramp down during, for example, device power up and power down, respectively, of the dual rail device of FIG. 1 and a header switch control signal, in accordance with some embodiments.

FIG. 2 is a timing diagram showing the VDDM power supply ramp up and ramp down during, for example, device power up and power down, respectively. Seven periods are shown in FIG. 2 and are labeled (a) to (g). During period (a), VDD is at its proper level and connected to the VDD domain circuit 114. VDDM is not on. During this time period, control signal VDDM_on_b is logical high. With VDDM_on_b at logical high, VDD header switch 118 is open, which disconnects VDD from the VDD domain circuit 114. Because VDD is disconnected from the VDD domain circuit, there is no leakage current between the VDDM and VDD domain circuits 112, 114.

During period (b), VDDM is turned on and begins to ramp up towards its proper value. During this time VDDM_on_b remains at logical high, which keeps VDD header switch 118 open and VDD disconnected from the VDD domain circuit 114. As such, there is no leakage current between the VDDM and VDD domain circuits 112, 114.

During period (c), upon VDDM reaching a rising threshold level, VDDM_on_b turns logical low, which closes VDD header switch 118 and allows VDD to connect to the VDD domain circuit 114. Some low level interface leakage current may pass between the VDDM and VDD domain circuits 112, 114 during this limited time period before VDDM reaches VDD.

During period (d) VDDM reaches its proper value and both VDDM domain and VDD domain circuits 112, 114 are operational. VDDM_on_b remains logical low during this time period. Leakage current is not a concern during this period (d).

During period (e), VDDM is turned off and ramps down. As with period (c), there may be low level interface leakage current passing between the VDDM and VDD domain circuits 112, 114 during this limited time period.

Upon VDDM reaching a falling threshold, VDDM_on_b goes logical high, which opens VDD header switch 118. This situation is illustrated in period (f). As with period (b), with VDD disconnected from the VDD domain circuit 114, there is no leakage current between the VDDM and VDD domain circuits 112, 114.

Finally, during period (g), VDDM is fully off. As with period (a), because VDD is disconnected from the VDD domain circuit 114, there is no leakage current between the VDDM and VDD domain circuits 112, 114.

In embodiments, the rising threshold for triggering VDDM_on_b is the same as the falling threshold for triggering VDDM_on_b. In embodiments, the rising threshold and falling threshold are different. In embodiments, the rising threshold is higher than the falling threshold or vice versa as the dictated by the desired design. In embodiments, the rising threshold is more than VDDM/2 so as to maintain VDD disconnected from the VDD domain circuit 114 for more than half of the rising period of VDDM, i.e., to delay connecting VDD to the VDD domain circuit 114 and to limit the period during which there is possible interface leakage current. In embodiments, the falling threshold is higher than VDDM/2 so as to disconnect VDD from the VDD domain circuit 114 early in the fall period, thus limiting the period during which there is possible interface leakage current.

Figure 3:
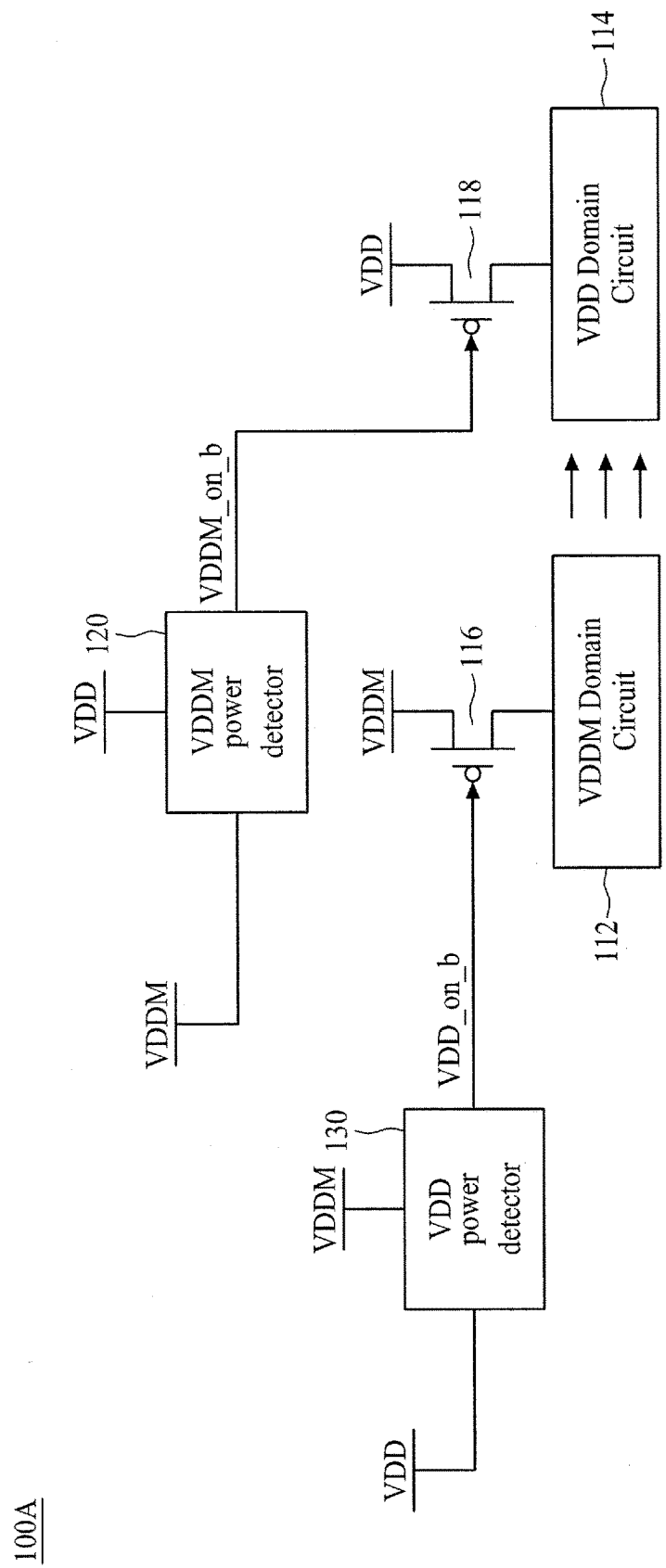
FIG. 3 illustrates a dual rail device, in accordance with some embodiments.

In another embodiment illustrated in FIG. 3, a dual rail device 100A includes a VDD power detector 130 in addition to or in lieu of VDDM power detector 120. VDD power detector 130 operates to control the VDDM domain header switch 116 through control signal VDD_on_b in much the same was as VDDM power detector 120 operates to control the VDD domain header switch 118 through control signal VDDM_on_b. That is, VDD power detector 130 is coupled to both VDD and VDDM and operates to open the VDDM domain header switch 116 to prevent or reduce VDDM domain leakage when VDD is lower than a given threshold or thresholds. The operation of VDD power detector 130 is explained in more detail in connection with the timing diagram of FIG. 4.

Figure 4:
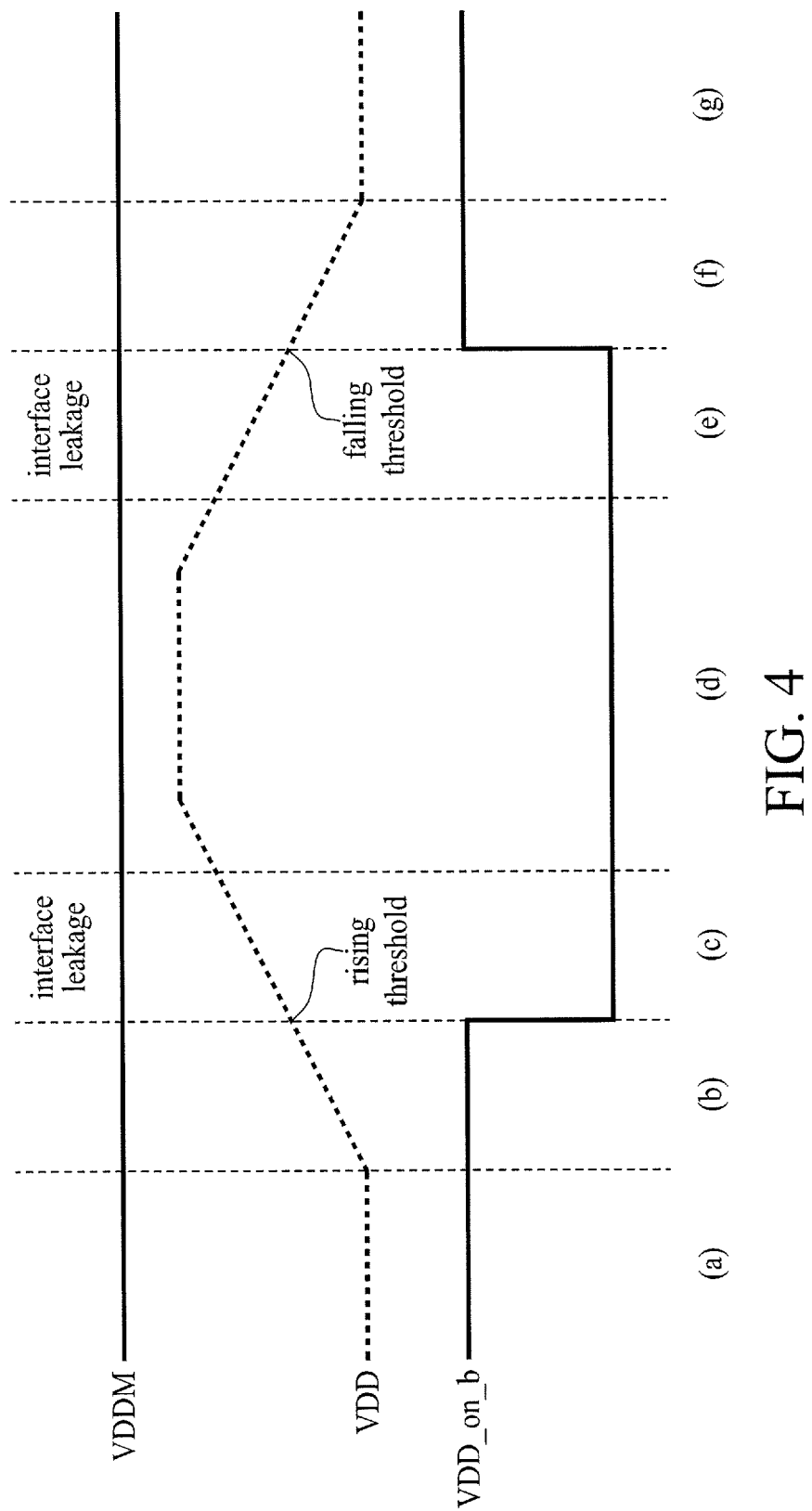
FIG. 4 is a timing diagram showing VDD power supply ramp up and ramp down during, for example, device power up and power down, respectively, of the dual rail device of FIG. 5 and a header switch control signal, in accordance with some embodiments.

FIG. 4 is a timing diagram showing the VDD power supply ramp up and ramp down during, for example, device power up and power down, respectively. Seven periods are shown in FIG. 4 and are labeled (a) to (g). During period (a), VDDM is at its proper level and connected to the VDDM domain circuit 112. VDD is not on. During this time period, control signal VDD_on_b is logical high. With VDD_on_b at logical high, VDDM header switch 116 is open, which disconnects VDDM from the VDDM domain circuit 112. Because VDDM is disconnected from the VDDM domain circuit 112, there is no leakage current between the VDDM and VDD domain circuits 112, 114.

During period (b), VDD is turned on and begins to ramp up towards its proper value. During this time VDD_on_b remains at logical high, which keeps VDDM header switch 116 open and VDDM disconnected from the VDDM domain circuit 112. As such, there is no leakage current between the VDDM and VDD domain circuits 112, 114.

During period (c), upon VDD reaching a rising threshold level, VDD_on_b turns logical low, which closes VDDM header switch 116 and allows VDDM to connect to the VDDM domain circuit 112. Some low level interface leakage current may pass between the VDDM and VDD domain circuits 112, 114 during this limited time period.

During period (d) VDD reaches its proper value and both VDDM domain and VDD domain circuits 112, 114 are operational. VDD_on_b remains logical low during this time period. There are no leakage current concerns during this period (d) with both VDDM domain and VDD domain circuits powered and operational and the VDDM value exceeding the value of VDD.

During period (e), VDD is turned off and ramps down. As with period (c), there may be low level interface leakage current passing between the VDDM and VDD domain circuits 112, 114 during this limited time period.

Upon VDD reaching a falling threshold, VDD_on goes logical high, which opens VDDM header switch 116. This situation is illustrated in period (f). As with period (b), with VDDM disconnected from the VDDM domain circuit 112, there is no leakage current between the VDDM and VDD domain circuits 112, 114.

Finally, during period (g), VDD is fully off. As with period (a), because VDDM is disconnected from the VDDM domain circuit 112, there is no leakage current between the VDDM and VDD domain circuits 112, 114.

In embodiments, the VDDM power detector 120 and the VDD power detector 130 can be or include a Schmitt trigger circuit. It is an active circuit which converts an analog input signal—here the monitored power supply voltage—to a digital output signal. The circuit retains its value until the input changes sufficiently to trigger a change. In embodiments, an inverting Schmitt trigger is used, such that when the input is higher than a chosen threshold, the output is low. When the input is below a chosen threshold the output is high, and when the input is between the two levels the output retains its value.

Figure 5:
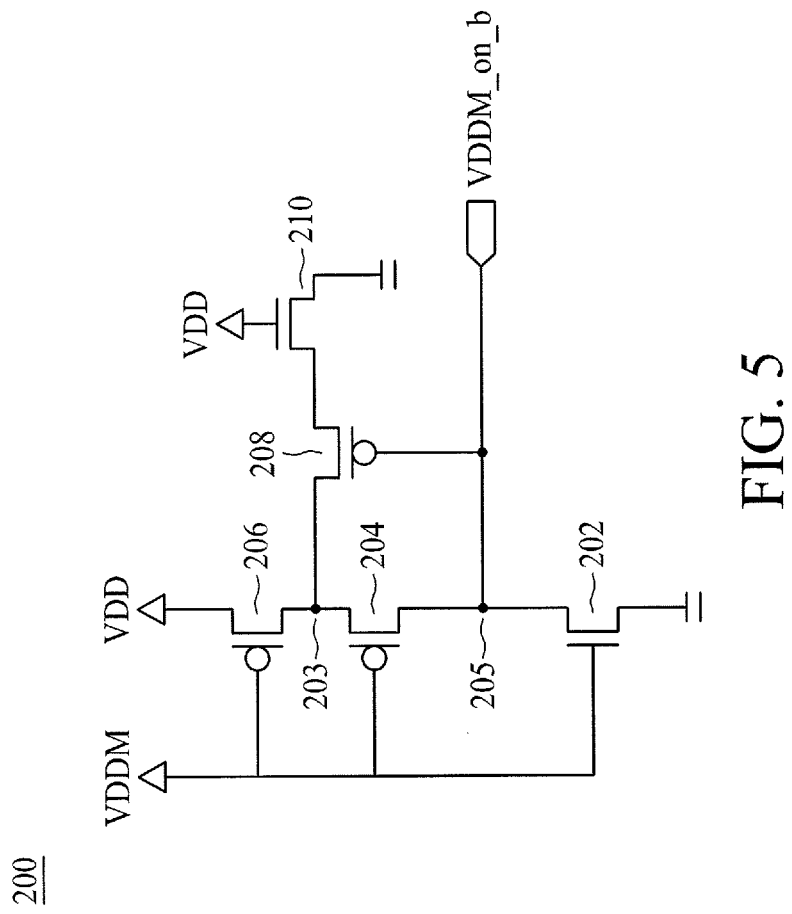
FIG. 5 illustrates a power detector circuit, in accordance with some embodiments.

FIG. 5 illustrates one embodiment of a VDDM power detector circuit 200 implemented as an inverting Schmitt trigger. The circuit 200 includes a transistor stack coupled between VDD and ground and including first NMOS transistor 202 and first and second PMOS transistors 204 and 206. The gate terminals of transistors 202, 204 and 206 are coupled to the monitored power supply voltage, which is VDDM in this embodiment. Third PMOS transistor 208 is coupled to node 203 between PMOS transistors 204, 206. The other source/drain terminal of PMOS 208 is coupled to a source/drain terminal of second NMOS transistor 210, which has a gate terminal tied high to VDD. It should be understood that "VDD" connected to the gate terminal of NMOS 210 and "VDD" tied to the source/drain terminal of PMOS 206 have the same logic high value dictated by the VDD domain but do not necessarily come from the same VDD branch and thus can ramp up/down together or independent of one another. The control signal VDDM_on_b is provided at node 205, which is between NMOS transistor 202 and PMOS transistor 204 and tied to the gate terminal of PMOS 208. This Schmitt trigger circuit 200 has a rising trigger point that is different than the falling trigger point, and specifically the rising trigger point is higher than the falling trigger point. That is, the rising trigger point is set exclusively by the inverter stack that includes NMOS 202, PMOS 204 and PMOS 206. That trigger point is determined by, and can be customized by, the number of NMOS and PMOS transistors in the stack and their driving strengths. The other transistors, specifically PMOS 208 and NMOS 210, are used to weaken the drive of the PMOS transistors 204, 206, which lowers the falling trigger point, making it more difficult to switch VDDM_on_b from low to high. This circuit is effective at reducing leakage current at both VDDM ramp up and ramp down and can be used if a design calls for making it more difficult to disconnect VDD from the VDD domain circuit on power down of VDDM, for example to avoid accidentally disconnecting VDD from the VDD domain circuit due to VDDM ripples (e.g., power bouncing) during normal operation.

Figure 6:
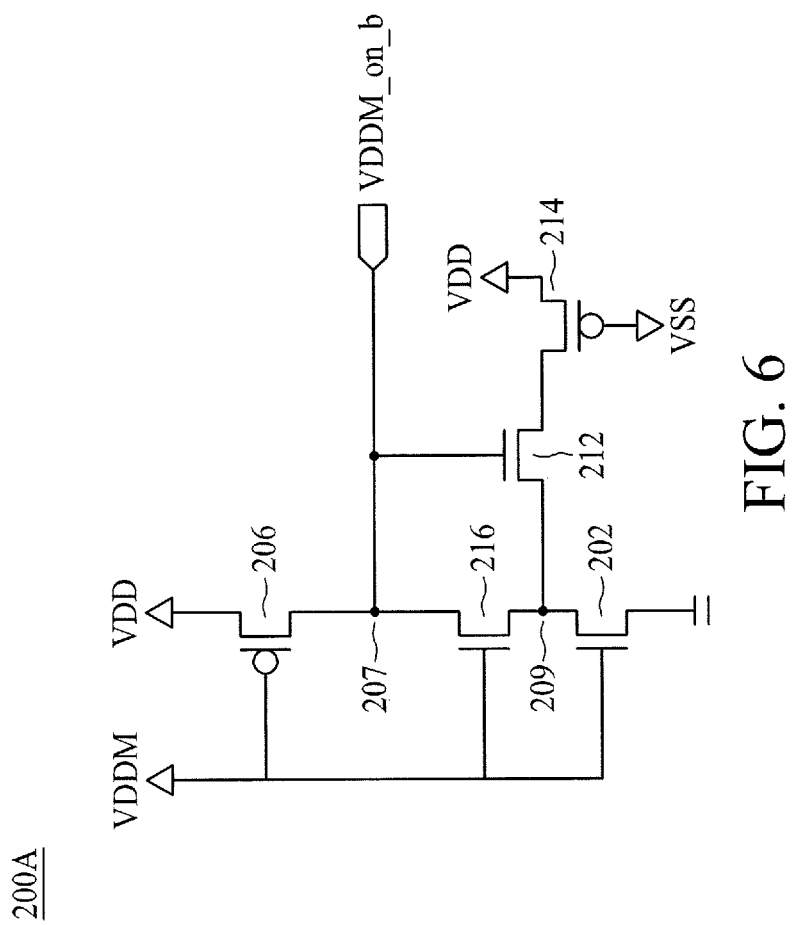
FIG. 6 illustrates a power detector circuit, in accordance with some embodiments.

FIG. 6 illustrates another embodiment of a VDDM power detector circuit 200A implemented as an inverting Schmitt trigger. Identical components from circuit 200 are similarly labeled in circuit 200A. The circuit 200A includes a transistor stack coupled between VDD and ground and includes NMOS transistors 202, 216 and PMOS transistor 206. PMOS transistor 204 is replaced with NMOS transistor 206, PMOS transistor 208 is replaced with NMOS transistor 212 and NMOS transistor 210 is replaced with PMOS transistor 214. PMOS transistor 214 is biased on by connecting its gate terminal to VSS. Control signal VDDM_on_b is provided at node 207 between the PMOS and NMOS portions of the transistor stack. This control signal biases the gate terminal of NMOS transistor 212, which is coupled between node 209 and PMOS transistor 214. This Schmitt trigger circuit 200A has a rising trigger point that is different than the falling trigger point, and specifically the rising trigger point is higher than the falling trigger point. That is, the falling trigger point is set exclusively by the inverter stack that includes NMOS transistors 202, 216 and PMOS 206. The falling trigger point is determined by, and can be customized by, the number of NMOS and PMOS transistors in the stack and their driving strengths. The other transistors, specifically NMOS 212 and PMOS 214, are used to weaken the drive of the NMOS transistors 202, 216, which reduces the ability of the NMOS transistors 202, 216 to drive VDDM_on_b from high to low and thus raises the rising trigger point above that of the falling trigger point. This circuit is effective at reducing leakage current at both VDDM ramp up and ramp down and can be used if a design calls for making it more difficult to trigger the connection of VDD to the VDD domain circuit on power up, for example to maintain VDD disconnected from the VDD domain circuit as long as possible.

Figure 7:
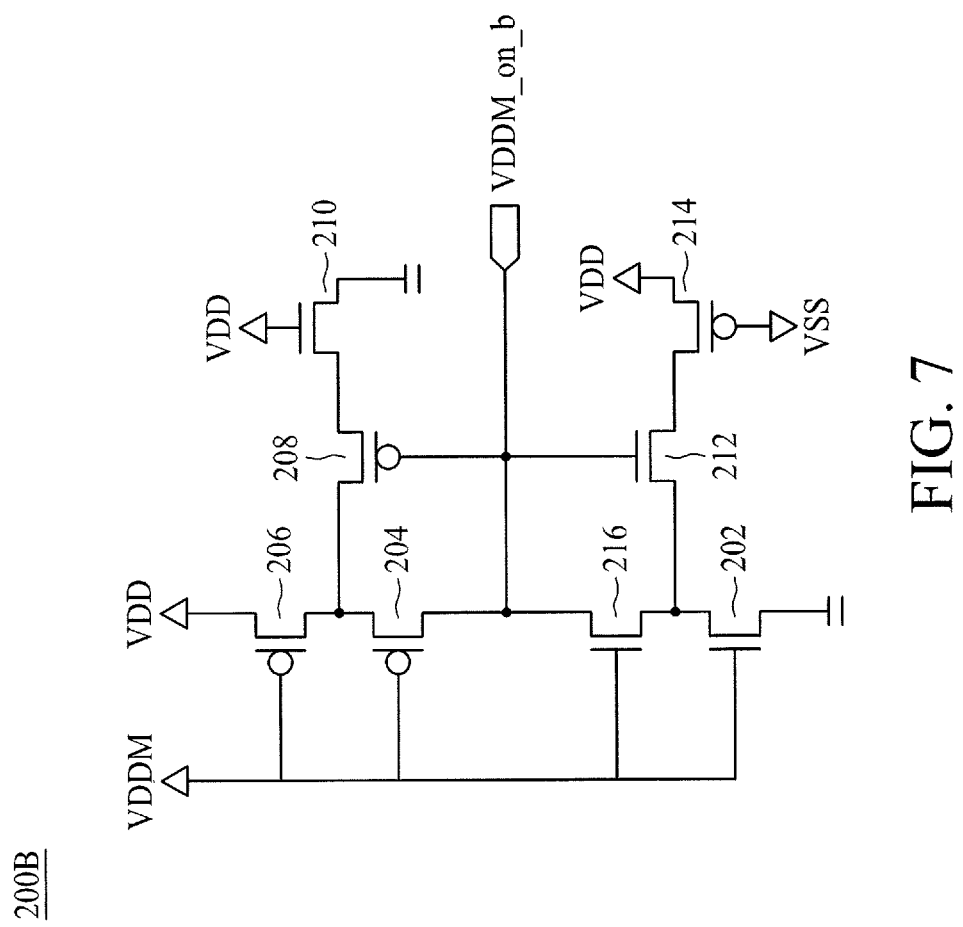
FIG. 7 illustrates a power detector circuit, in accordance with some embodiments.

FIG. 7 is another embodiment of a VDDM power detector circuit 200B. This embodiment sets the rising trigger point above the switching point of the inverter stack (i.e., comprising NMOS transistors 202, 216 and PMOS transistors 204, 206) and the falling trigger point below the switching point of the inverter stack. The circuit 200B is essentially a combination of circuits 200 and 200A from FIGS. 5 and 6, respectively and like components are labeled in the same manner. This configuration ensures that VDDM_on_b is delayed in going low when VDDM rises, thereby maintaining VDD disconnected from the VDD domain circuit, and ensures that VDDM_on_b does not prematurely switch to disconnect VDD from the VDD domain circuit when VDDM falls. This approach reduces leakage current during both ramp up and ramp down of VDDM.

It should be understood that FIGS. 5-7 illustrate embodiments of a VDDM power detector, but the same designs could be used for a VDD power detector only with VDD replaced with VDDM and VDDM replaced with VDD, as appropriate.

In embodiments, the power detector described herein is active to disconnect a VDD power supply from VDD domain circuit to reduce interface leakage current while VDDM is floating, off, ramping up or ramping down. In embodiments, the power detector described herein is active to disconnect a VDDM power supply from the VDDM domain circuit to reduce interface leakage current while VDD is floating, off, ramping up or ramping down.

In one embodiment, assuming a VDD value in the spec operating range from 0.5V to 0.8V and a VDDM value in the spec operating range of 0.6V to 1.0V, the rising threshold to deactivate the VDDM power detector (i.e., make VDDM_on_b go low) may be 0.6V or less, and the VDDM falling threshold to activate the VDDM power detector (i.e., make VDDM_on_b go high) may be 0.6V or lower. In one embodiment, assuming a VDD value in the spec operating range from 0.5V to 1.1V and a VDDM value in the spec operating range from 0.45V to 0.9V, the rising threshold to deactivate the VDDM power detector (i.e., make VDDM_on_b go low) may be 0.45V, and the VDDM falling threshold to activate the VDDM power detector (i.e., make VDDM_on_b go high) may be 0.45V or lower.

In embodiments, the power detector output can be used to preset or reset the state machine in the timer/controller with an expected state value.

Figure 8:
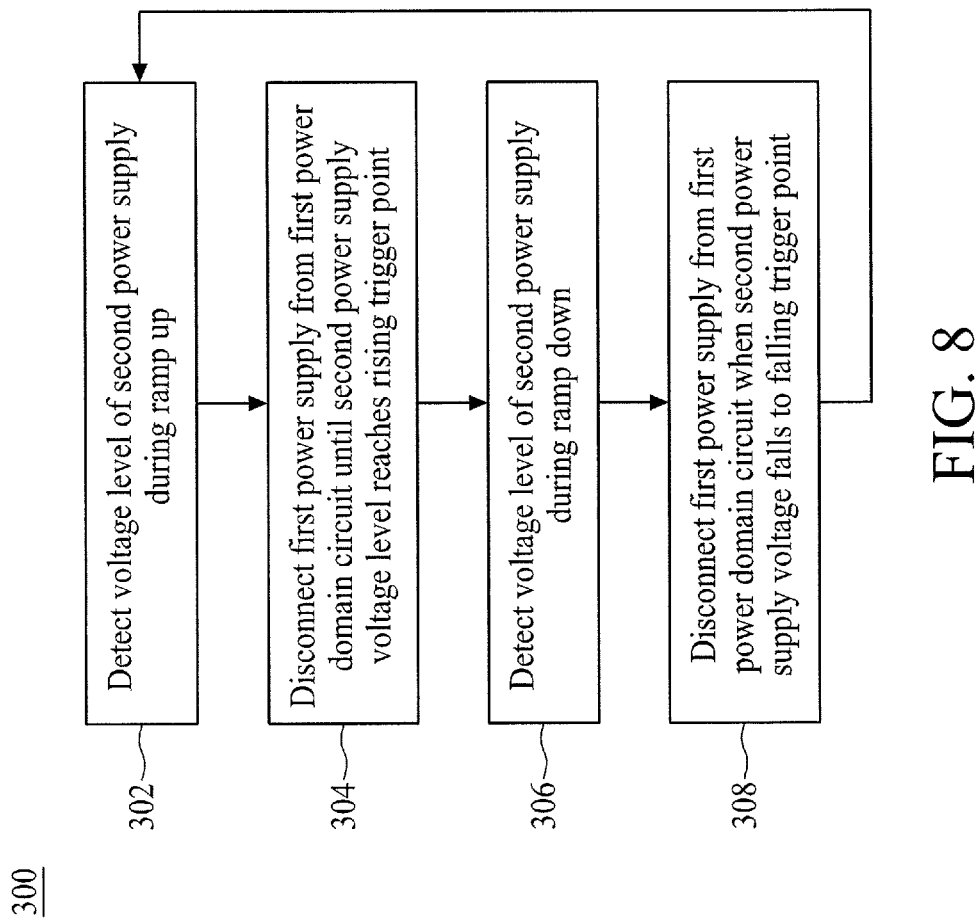
FIG. 8 illustrates a method, in accordance with some embodiments.

FIG. 8 illustrates a method 300 in accordance with embodiments of operating a power detector in a dual rail device. At step 302, the voltage level of a second power supply is detected during ramp up of the second power supply. At step 304, the first power supply is disconnected from the first power domain circuit until the second power supply voltage level reaches the rising trigger point. At step 306, the voltage level of the second powers supply is detected during ramp down. At step 308, the first power supply is disconnected from the first power domain circuit when the second power supply voltage falls to the falling triggers point. The method is then repeated.

In embodiments of a dual rail device, the dual rail device includes a first power domain circuit coupled to a first power supply through a first header control switch and a second power domain circuit coupled to a second power supply. The first and second power supplies have different steady-state voltage levels. The first power domain circuit is interfaced to the second power domain circuit. The device also includes a power detector circuit for providing a control signal for the first header control switch responsive to a voltage level of the second power supply.

In embodiments of a dual rail device, the dual rail device includes a first power domain circuit coupled to a first power supply through a first header control switch; a second power domain circuit coupled to a second power supply, wherein the first and second power supplies have different steady-state voltage levels and wherein the first power domain circuit is interfaced to the second power domain circuit; and a power detector circuit for providing a control signal for the first header control switch responsive to a voltage level of the second power supply. The power detector circuit is configured to control the first header control switch to connect the first power domain circuit to the first power supply when the second power supply is at its steady-state voltage level, and the power detector circuit is configured to control the first header control switch to disconnect the first power domain circuit from the first power supply during at least portion of a period when the second power supply transitions between an off state and its steady-state voltage level, thereby reducing interface leakage current between the first and second power domain circuits during the period.

In embodiments of a dual raise device, the dual rail device includes a first power domain circuit coupled to a first power supply through a first header control switch; a second power domain circuit coupled to a second power supply, wherein the first and second power supplies have different steady-state voltage levels and wherein the first power domain circuit is interfaced to the second power domain circuit; and a power detector circuit for providing a control signal for the first header control switch responsive to a voltage level of the second power supply. The power detector circuit is configured to control the first header control switch to disconnect the first power domain circuit from the first power supply during at least portion of a period when the second power supply transitions between an off state and its steady-state voltage level, thereby reducing interface leakage current between the first and second power domain circuits during the period. The power detector has a rising trigger point for connecting the first power domain circuit to the first power supply when the second power supply transitions from the off state to its steady-state voltage level and a falling trigger point for disconnecting the first power supply from the first power domain circuit when the second power supply transitions from its steady-state voltage level to the off state. The dual rail device is a static random access memory (SRAM), and one of the first and second power domain circuits is an array of SRAM memory cells and the other of the first and second power domain circuits is a periphery logic circuit.

In embodiments, a method of operating a dual-rail device having a first power domain circuit operable with a first power supply and a second power domain circuit operable with a second power supply, includes the steps of detecting a voltage level of the second power supply during ramp up; disconnecting the first power supply from the first power domain circuit during ramp up of the second power supply until the second power supply voltage level reaches a rising trigger point; detecting a voltage level of the second power supply during ramp down; and disconnecting the first power supply from the first power domain circuit when the second power supply falls to a falling trigger point during ramp down of the second power supply.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual rail device comprising:
a first power domain circuit coupled to a first power supply through a first header control switch;
a second power domain circuit coupled to a second power supply, wherein the first and second power supplies have different steady-state voltage levels and wherein the first power domain circuit is interfaced to the second power domain circuit; and
a power detector circuit for providing a control signal for controlling the first header control switch responsive to detection of a voltage level of the second power supply.

2. The dual rail device of claim 1, wherein the second power domain circuit is coupled to the second power supply through a second header control switch.

3. The dual rail device of claim 2, further comprising a second power detector circuit for providing a second control signal for the second header control switch responsive to a voltage level of the first power supply.

4. The dual rail device of claim 1, wherein the dual rail device is a static random access memory (SRAM).

5. The dual rail device of claim 4, wherein one of the first and second power domain circuits is an array of SRAM memory cells and the other of the first and second power domain circuits is a periphery logic circuit.

6. The dual rail device of claim 1, wherein the power detector circuit is operational to control the first header control switch to connect the first power supply to the first power domain circuit when the second power supply is at its steady-state voltage level and disconnect the first power supply from the first power domain circuit during at least a portion of a period when the second power supply transitions between an off state and its steady-state voltage level.

7. The dual rail device of claim 6, wherein a rising trigger point for connecting the first power supply to the first power domain circuit when the second power supply transitions from the off state to its steady-state voltage level is different from a falling trigger point when the second power supply transitions from its steady-state voltage level to the off state.

8. The dual rail device of claim 7, wherein the rising trigger point is higher than the falling trigger point.

9. The dual rail device of claim 7, wherein the falling trigger point is higher than the rising trigger point.

10. The dual rail device of claim 1, wherein the power detector circuit is a Schmitt trigger circuit.

11. The dual rail device of claim 10, wherein the Schmitt trigger circuit includes an inverter, the inverter being coupled between the first power supply and a ground node, the inverter having an input coupled to the second power supply and an output for providing the control signal.

12. The dual rail device of claim 11,
wherein the inverter includes a stack of NMOS and PMOS transistors and the stack includes more PMOS transistors than NMOS transistors,
wherein the Schmitt trigger circuit further includes a PMOS transistor having a gate terminal coupled to the output, the PMOS transistor having a first source/drain terminal coupled to the PMOS transistors of the inverter stack and a second source drain/terminal coupled to a first source/drain terminal of an NMOS transistor, the NMOS transistor having a second source/drain terminal coupled to the ground node and a gate terminal tied to a logical high voltage.

13. The dual rail device of claim 11,
wherein the inverter includes a stack of NMOS and PMOS transistors and the stack includes more NMOS transistors than PMOS transistors,
wherein the Schmitt trigger circuit further includes an NMOS transistor having a gate terminal coupled to the output, the NMOS transistor having a first source/drain terminal coupled to the NMOS transistors of the inverter stack and a second source drain/terminal coupled to a first source/drain terminal of a PMOS transistor, the PMOS transistor having a second source/drain terminal coupled to the first power supply and a gate terminal tied to a logical low voltage.

14. The dual rail device of claim 11,
wherein the inverter includes at least first and second NMOS transistors and first and second PMOS transistors,
wherein the Schmitt trigger circuit further includes:
    a third PMOS transistor having a gate terminal coupled to the output, the third PMOS transistor having a first source/drain terminal coupled to the PMOS transistors of the inverter and a second source drain/terminal coupled to a first source/drain terminal of a third NMOS transistor, the third NMOS transistor having a second source/drain terminal coupled to the ground node and a gate terminal tied to a logical high voltage; and
    a fourth NMOS transistor having a gate terminal coupled to the output, the fourth NMOS transistor having a first source/drain terminal coupled to the NMOS transistors of the inverter and a second source drain/terminal coupled to a first source/drain terminal of a fourth PMOS transistor, the fourth PMOS transistor having a second source/drain terminal coupled to the first power supply and a gate terminal tied to a logical low voltage.

15. A dual rail device comprising:
a first power domain circuit coupled to a first power supply through a first header control switch;
a second power domain circuit coupled to a second power supply, wherein the first and second power supplies have different steady-state voltage levels and wherein the first power domain circuit is interfaced to the second power domain circuit; and
a power detector circuit for providing a control signal for the first header control switch responsive to a voltage level of the second power supply,
wherein the power detector circuit is configured to control the first header control switch to connect the first power domain circuit to the first power supply when the second power supply is at its steady-state voltage level, and
wherein the power detector circuit is configured to control the first header control switch to disconnect the first power domain circuit from the first power supply during at least a portion of a period when the second power supply transitions between an off state and its steady-state voltage level.

16. The dual rail device of claim 15, wherein the power detector has a rising trigger point for connecting the first power domain circuit to the first power supply when the second power supply transitions from the off state to its steady-state voltage level and a falling trigger point for disconnecting the first power supply from the first power domain circuit when the second power supply transitions from its steady-state voltage level to the off state.

17. The dual rail device of claim 16, wherein the rising trigger point and falling trigger point are at different voltage levels.

18. The dual rail device of claim 15, wherein the power detector includes a Schmitt trigger.

19. The dual rail device of claim 15, wherein the second power domain circuit is coupled to the second power supply through a second header control switch, wherein the dual rail device further comprises a second power detector circuit for providing a second control signal for the second header control switch responsive to a voltage level of the first power supply,
wherein the second power detector circuit is configured to control the second header control switch to connect the second power domain circuit to the second power supply when the first power supply is at its steady-state voltage level, and
wherein the second power detector is configured to control the second header control switch to disconnect the second power domain circuit from the second power supply during at least a portion of a second period when the first power supply transitions between an off state and its steady-state voltage level, thereby reducing interface leakage current between the first and second power domain circuits during the second period.

20. A method of operating a dual-rail device having a first power domain circuit operable with a first power supply and a second power domain circuit operable with a second power supply, comprising the steps of:
    detecting a voltage level of the second power supply during ramp up;
    disconnecting the first power supply from the first power domain circuit during ramp up of the second power supply until the second power supply voltage level reaches a rising trigger point;
    detecting a voltage level of the second power supply during ramp down; and
    disconnecting the first power supply from the first power domain circuit when the second power supply falls to a falling trigger point during ramp down of the second power supply.

* * * * *